United States Patent
Hou

(10) Patent No.: US 8,614,430 B2
(45) Date of Patent: Dec. 24, 2013

(54) RESET CIRCUIT FOR ELECTRONIC DEVICES HAVING PHOTOELECTRIC COUPLER

(75) Inventor: Chuan-Tsai Hou, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 297 days.

(21) Appl. No.: 13/172,851

(22) Filed: Jun. 30, 2011

(65) Prior Publication Data

US 2012/0305814 A1    Dec. 6, 2012

(30) Foreign Application Priority Data

May 31, 2011    (TW) .................................. 100118942

(51) Int. Cl.
*G02B 27/00*    (2006.01)
*H03L 7/00*    (2006.01)
(52) U.S. Cl.
USPC .......................................... 250/551; 327/143

(58) Field of Classification Search
USPC ................ 3/551; 327/142, 143, 198; 250/551
See application file for complete search history.

(56) References Cited

U.S. PATENT DOCUMENTS 6,473,852 B1 * 10/2002 Hanjani .......................... 713/1
2012/0218334 A1 * 8/2012 Bergstedt et al. ............... 347/11

* cited by examiner

*Primary Examiner* — Thanh Luu
(74) *Attorney, Agent, or Firm* — Altis Law Group, Inc.

(57) ABSTRACT

A reset circuit includes a power supply, a metal-oxide-semiconductor field-effect transistor (MOSFET) that has a gate, a drain, and a source, a capacitor, a Schmitt trigger; and an inverter. When a voltage of the power supply is applied to the gate and turns on the MOSFET, the power supply charges the capacitor. After a predetermined delay time, a voltage of the capacitor reaches a threshold voltage of the Schmitt trigger and turns on the Schmitt trigger, and the capacitor discharges through the Schmitt trigger to correspondingly generate a reset signal output by the inverter to reset an electronic device.

9 Claims, 2 Drawing Sheets

RESET CIRCUIT FOR ELECTRONIC DEVICES HAVING PHOTOELECTRIC COUPLER

BACKGROUND

1. Technical Field

The present disclosure relates to reset circuits for electronic devices, and particularly to a reset circuit having stable outputs.

2. Description of Related Art

Many electronic devices use reset circuits for initialization. Generally, when an electronic device is turned on, a reset circuit of the electronic device does not need to generate reset signals for the electronic device as a first step. After waiting for a predetermined delay time to ensure that the electronic device has already been supplied with working electric power as normal, the reset circuit should generate the reset signals, such that the electronic device can be properly initialized.

RC delay circuits are often used in the reset circuits for achieving the aforementioned effect. FIG. 2 shows a typical reset circuit, which includes a power supply VCC, a resistor R, a capacitor C, a Schmitt trigger U11, and an inverter U12. The resistor R and the capacitor C are connected in series between the power supply VCC and ground. An input end of the Schmitt trigger U11 is connected between the resistor R and the capacitor C, and an output end of the Schmitt trigger U11 is connected to an input end of the inverter U12. An output end of the inverter U12 is used to provide a reset signal to an electronic device (not shown). In use, the power supply VCC charges the capacitor C via the resistor R. After waiting for a predetermined delay time to ensure that the electronic device has already been supplied with normal working electric power, the voltage of the capacitor C reaches a threshold voltage of the Schmitt trigger U11, and thus the Schmitt trigger U11 is turned on. The capacitor C discharges through the Schmitt trigger U1 (i.e., inputs a predetermined logic 1 signal to the Schmitt trigger U11), and the Schmitt trigger U11 correspondingly outputs a predetermined logic 0 signal. The inverter U12 receives the logic 0 signal and correspondingly outputs a logic 1 signal to the electronic device as the reset signal.

During the delay time (i.e., when the capacitor C is being charged), the voltage of the capacitor C is not high enough to turn on the Schmitt trigger U11, and the capacitor C is unable to discharge. Therefore, if the power supply VCC is by mistake or otherwise turned off during the delay time, charges may remain in the capacitor C. The next time the reset circuit is used, the residual charges may interfere with the charging and discharging processes of the capacitor C, and thus the delay and application times of the reset circuit may be changed.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figures.

DETAILED DESCRIPTION

Figure 1:
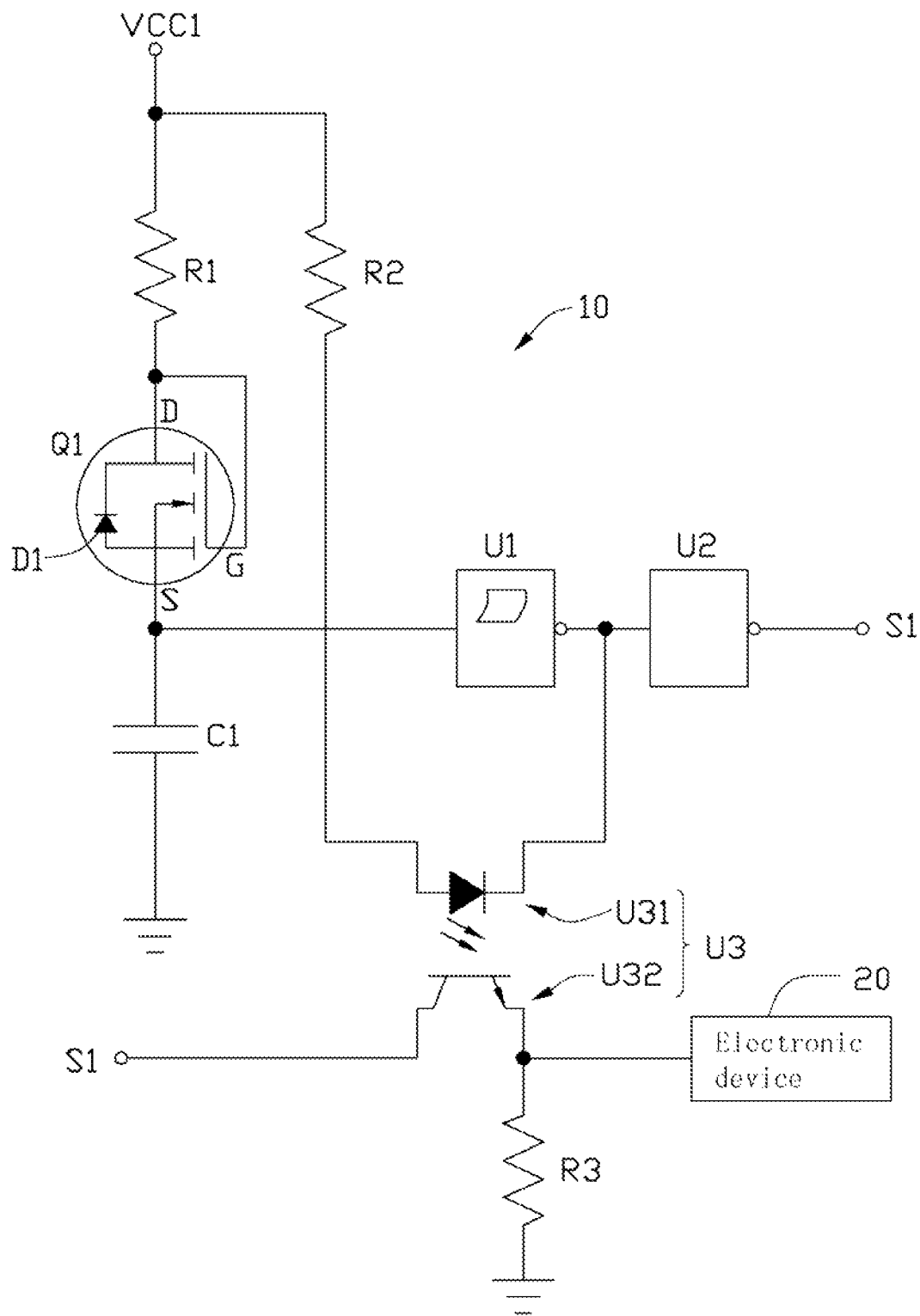
FIG. 1 is a circuit diagram of a reset circuit, according to an exemplary embodiment.
Figure 2:
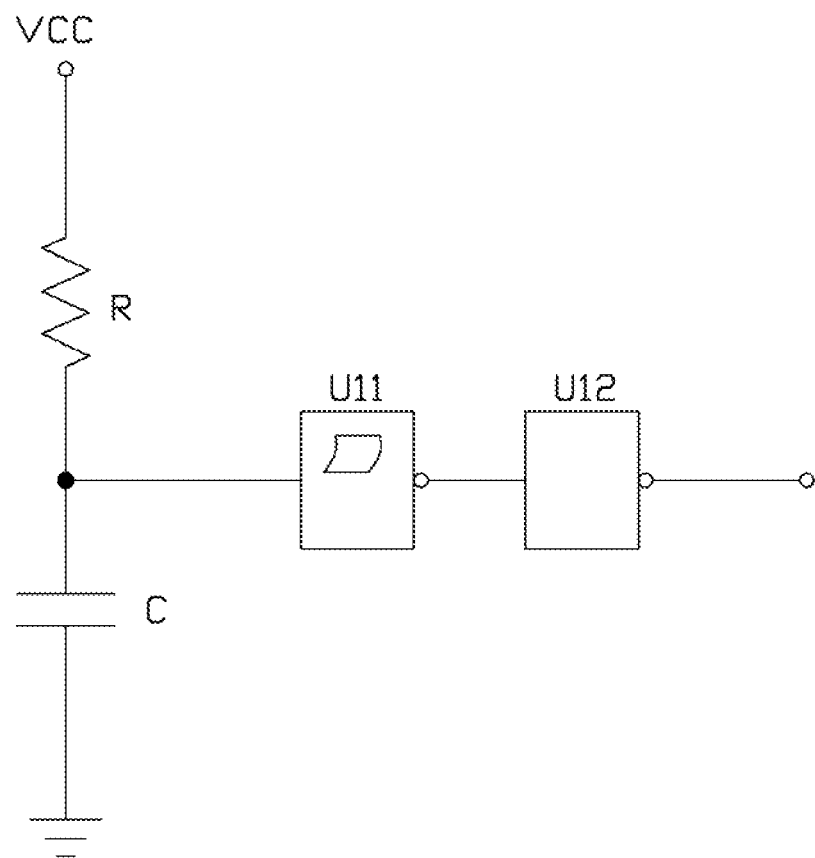
FIG. 2 is a circuit diagram of a typical reset circuit.

FIG. 1 shows a circuit diagram of a reset circuit 10, according to an exemplary embodiment. The reset circuit 10 can generate reset signals for an electronic device 20. The electronic device 20 can be a personal computer (PC) or other electrical appliances.

The reset circuit 10 includes a power supply VCC1, a metal-oxide-semiconductor field-effect transistor (MOSFET) Q1, a first resistor R1, a second resistor R2, a third resistor R3, a capacitor C1, a Schmitt trigger U1, an inverter U2, and a photoelectric coupler U3. The first resistor R1 is connected between the power supply VCC1 and both a gate G and a drain D of the MOSFET Q1. A source S of the MOSFET Q1 is connected to one end of the capacitor C, and the other end of the capacitor C is grounded. An input end of the Schmitt trigger U1 is connected to the end of the capacitor C that is connected to the source S of the MOSFET Q1, and an output end of the Schmitt trigger U1 is connected to an input end of the inverter U2. An output end of the inverter U2 is used to provide a reset signal S1 for the electronic device 20.

The photoelectric coupler U3 includes a light emitting unit U31 and a light receiving unit U32. A positive end of the light emitting unit U31 is connected to the power supply VCC1 through the second resistor R2, and a negative end of the light emitting unit U31 is connected to the output end of the Schmitt trigger U1. An input end of the light receiving unit U32 receives the reset signal S1. An output end of the light receiving unit U32 is connected to the electronic device 20, and is also connected to ground through the third resistor R3. In this embodiment, the light emitting unit U31 is a photo diode, and the light receiving unit U32 is a photo transistor. An anode and a cathode of the light emitting unit U31 are respectively used as the positive end and the negative end of the light emitting unit U31. A collector and an emitter of the light receiving unit U32 are respectively used as the input end and the output end of the light receiving unit U32.

In use, a voltage of the power supply VCC1 is applied to the gate G of the MOSFET Q1 through the first resistor R1 and this turns on the MOSFET Q1. Thus, the power supply VCC1 charges the capacitor C1 via the first resistor R1, the drain D of the MOSFET Q1, and the source S of the MOSFET Q1. The first resistor R1 limits the charging current to protect the MOSFET Q1 and the capacitor C1 from over-current. At the same time, a voltage of the power supply VCC1 is applied to the positive end of the light emitting unit U31 through the second resistor R2 and this turns on the light emitting unit U31. The second resistor R2 limits current passing through the light emitting unit U31 to protect the light emitting unit U31 from over-current. Correspondingly, the light emitting unit U31 emits light to turn on the light receiving unit U32, and thus the voltages at the input and output ends of the light receiving unit U32 have substantially the same value.

After waiting for a predetermined delay time to ensure that the electronic device 20 has already been supplied with normal working electric power, the voltage on the end of the capacitor C1 that is connected to the source S of the MOSFET Q1 reaches a threshold voltage of the Schmitt trigger U1, and the Schmitt trigger U1 is turned on. The capacitor C discharges through the Schmitt trigger U1 (i.e., inputs a predetermined logic 1 signal to the Schmitt trigger U1), and the Schmitt trigger U1 correspondingly outputs a predetermined logic 0 signal. The inverter U2 receives the logic 0 signal and correspondingly outputs a logic 1 signal that is used as the reset signal S1. The reset signal S1 is received by the input end of the light receiving unit U32. Since the light receiving unit U32 is already on, the reset signal S1 is transmitted to the electronic device 20 through the light receiving unit U32 to reset the electronic device 20.

During the delay time (i.e., when the capacitor C1 is being charged), the voltage on the end of the capacitor C1 that is connected to the source S of the MOSFET Q1 is not high enough to turn on the Schmitt trigger U1. If the power supply VCC is turned off during the delay time, the capacitor C1 is unable to discharge through the Schmitt trigger U1. However, according to the known characteristics of MOSFETs, a parasitic diode D1 effectively exists between the source S and the drain D of the MOSFET Q1. Therefore, in this situation, the capacitor C1 with any charge which is insufficient to turn on the Schmitt trigger U1 can discharge through the parasitic diode D1 formed between the source S and the drain D of the MOSFET Q1. In this way, unwanted charges on the capacitor C1 are removed and prevented from interfering with subsequent uses of the reset circuit 10. In this discharging process, the first resistor R1 also limits the discharging current to protect the MOSFET Q1 and the capacitor C1 from overcurrent.

Furthermore, since the capacitor C1 does not discharge through the Schmitt trigger U1, the Schmitt trigger U1 remains off and continues to output a predetermined logic 1 signal. The logic 1 signal output by the Schmitt trigger U1 is applied to the negative end of the light emitting unit U31, and the voltage of the logic 1 signal output by the Schmitt trigger U1 makes a potential difference between the positive end and the negative end of the light emitting unit U31 to be not high enough to turn on the light emitting unit U31. Since the light emitting unit U31 does not emit light, the light receiving unit U32 remains off (i.e., the input end and the output end of the light receiving unit U32 are not at substantially the same value), and no signal output from the inverter U2 is transmitted to the electronic device 20 through the light receiving unit U32. At the same time, the third resistor R3 is used as a pull-down resistor, to remove any ambiguous voltage from the output end of the light receiving unit 32 and prevent any anomalous reset of the electronic device 20.

In the reset circuit 10, the capacitor C1 can discharge through the parasitic diode D1 inherent in the MOSFET Q1, to remove unwanted charges. Even if the power supply VCC1 is mistakenly turned off during the predetermined delay time (i.e., the charging process of the capacitor C is mistakenly interrupted), charges accumulated on the capacitor C1 (which become unwanted as a result of any interruption) are immediately removed and prevented from adversely affecting the next use of the reset circuit 10. Furthermore, in this situation, the photoelectric coupler U3 prevents signals which are output by the inverter U2 from being transmitted to the electronic device 20, and cooperates with the third resistor R3 to pull down the voltage provided to the electronic device 20, such that the electronic device 20 is prevented from being mistakenly reset by extraneous voltages.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A reset circuit, comprising:
   a power supply;
   a metal-oxide-semiconductor field-effect transistor (MOSFET) that has a gate, a drain, and a source; both the gate and the drain connected to the power supply;
   a capacitor that has one end connected to the source and another end grounded;
   a Schmitt trigger connected to the capacitor;
   an inverter connected to the Schmitt trigger; and
   a photoelectric coupler comprising a light emitting unit and a light receiving unit; the light emitting unit connected to the power supply, and the light receiving unit connected to an electronic device; wherein a voltage of the capacitor charges through the source of the MOSFET by the power supply, and discharges upon reaching a threshold voltage of the Schmitt trigger causing the Schmitt trigger to generate a reset signal output by the inverter; a voltage of power supply turns on the light emitting unit, the light emitting unit emits light to turn on the light receiving unit, and the light receiving unit receives and transmits the reset signal to the electronic device to reset the electronic device.

2. The reset circuit as claimed in claim 1, further comprising a parasitic diode connected between the source and the drain of the MOSFET, wherein the capacitor discharges through the parasitic diode in response to the voltage of the capacitor not reaching the threshold voltage of the Schmitt trigger.

3. The reset circuit as claimed in claim 1, further comprising a first resistor connected between the power supply and the drain of the MOSFET.

4. The reset circuit as claimed in claim 1, wherein the voltage of the capacitor reaches the threshold voltage of the Schmitt trigger after a predetermined delay time.

5. The reset circuit as claimed in claim 1, wherein a positive end of the light emitting unit is connected to the power supply, and a negative end of the light emitting unit is connected to the Schmitt trigger; and an input end of the light receiving unit receives the reset signal, and an output end of the light receiving unit is connected to the electronic device.

6. The reset circuit as claimed in claim 5, further comprising a second resistor connected between the power supply and the positive end of the light emitting unit.

7. The reset circuit as claimed in claim 5, wherein when the Schmitt trigger is turned off, the Schmitt trigger outputs a voltage to the negative of the light emitting unit to make a potential difference between the positive end and the negative end of the light emitting unit to be not high enough to turn the light emitting unit on, such that the light emitting unit and the light receiving unit are both turned off, and the reset signal is prevented from being transmitted to the electronic device through the light receiving unit.

8. The reset circuit as claimed in claim 7, further comprising a third resistor connected to the output end of the light receiving unit and a ground; wherein when the light receiving unit is turned off, the third resistor pulls a voltage on the output end of the light receiving unit down, such that the electronic device is prevented from being mistakenly reset by the voltage on the output end of the light receiving unit.

9. The reset circuit as claimed in claim 8, wherein the light emitting unit is a photo diode, and the light receiving unit is a photo transistor; an anode and a cathode of the light emitting unit are respectively used as the positive end and the negative end of the light emitting unit, and a collector and an emitter of the light receiving unit are respectively used as the input end and the output end of the light receiving unit.

\* \* \* \* \*